United States Patent
Kao et al.

(10) Patent No.: US 8,987,139 B2
(45) Date of Patent: Mar. 24, 2015

(54) METHOD OF PATTERNING A LOW-K DIELECTRIC FILM

(71) Applicants: Chia-Ling Kao, San Jose, CA (US); Sean S. Kang, San Ramon, CA (US); Srinivas D. Nemani, Sunnyvale, CA (US)

(72) Inventors: Chia-Ling Kao, San Jose, CA (US); Sean S. Kang, San Ramon, CA (US); Srinivas D. Nemani, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 14/159,832

(22) Filed: Jan. 21, 2014

(65) Prior Publication Data

US 2014/0213060 A1 Jul. 31, 2014

Related U.S. Application Data

(60) Provisional application No. 61/757,826, filed on Jan. 29, 2013.

(51) Int. Cl.
*H01L 21/311* (2006.01)
*H01L 21/321* (2006.01)
*H01L 21/3213* (2006.01)

(52) U.S. Cl.
CPC .... *H01L 21/31144* (2013.01); *H01L 21/31116* (2013.01); *H01L 21/321* (2013.01); *H01L 21/32136* (2013.01)
USPC ............................ 438/695; 438/696; 438/703

(58) Field of Classification Search
USPC ........................................ 438/695, 696, 703
See application file for complete search history.

(56) References Cited

U.S. PATENT DOCUMENTS

| | | | |
|---|---|---|---|
| 6,387,819 B1 | 5/2002 | Yu | |
| 8,012,365 B2* | 9/2011 | Dussart et al. | 216/37 |
| 2002/0190651 A1* | 12/2002 | Law et al. | 313/587 |
| 2003/0013311 A1 | 1/2003 | Chang et al. | |
| 2003/0153194 A1* | 8/2003 | He et al. | 438/714 |
| 2004/0222190 A1* | 11/2004 | Horiguchi et al. | 216/79 |
| 2005/0110152 A1 | 5/2005 | Wang et al. | |
| 2007/0032087 A1 | 2/2007 | Nishino et al. | |
| 2007/0080136 A1 | 4/2007 | Takata et al. | |
| 2007/0245959 A1 | 10/2007 | Paterson et al. | |
| 2008/0067583 A1 | 3/2008 | Kidoh et al. | |
| 2008/0286978 A1* | 11/2008 | Chen et al. | 438/713 |
| 2011/0306214 A1 | 12/2011 | Zin | |
| 2014/0120726 A1 | 5/2014 | Nemani et al. | |

OTHER PUBLICATIONS

International Search Report and Written Opinion of the International Searching Authority dated May 28, 2014, in International Patent Application No. PCT/US2014/013046.
U.S. Appl. No. 14/059,996, filed Oct. 22, 2013, 44 pgs.

* cited by examiner

*Primary Examiner* — Karen Kusumakar
(74) *Attorney, Agent, or Firm* — Blakely Sokoloff Taylor Zafman LLP

(57) ABSTRACT

Methods of patterning low-k dielectric films are described. In an example, In an embodiment, a method of patterning a low-k dielectric film involves forming and patterning a metal nitride mask layer above a low-k dielectric layer. The low-k dielectric layer is disposed above a substrate. The method also involves passivating the metal nitride mask layer by treating with a plasma based on $O_2/N_2/Si_xF_y$. The method also involves etching a portion of the low-k dielectric layer.

20 Claims, 11 Drawing Sheets

OXIDIZING ASH

~40% in SiCOH with k= 2.5

~10% in SiCOH with k= 2.5

REDUCING ASH

METHOD OF PATTERNING A LOW-K DIELECTRIC FILM

CROSS-REFERENCE TO RELATED APPLICATIONS

This application claims the benefit of U.S. Provisional Application No. 61/757,826, filed on Jan. 29, 2013, the entire contents of which are hereby incorporated by reference herein.

BACKGROUND

1) Field

Embodiments of the present invention pertain to the field of semiconductor processing and, in particular, to methods of patterning low-k dielectric films.

2) Description of Related Art

In semiconductor manufacturing, a low-k dielectric is a material with a small dielectric constant relative to silicon dioxide. Low-k dielectric material implementation is one of several strategies used to allow continued scaling of microelectronic devices. In digital circuits, insulating dielectrics separate the conducting parts (e.g., wire interconnects and transistors) from one another. As components have scaled and transistors have moved closer together, the insulating dielectrics have thinned to the point where charge build-up and crosstalk adversely affect the performance of the device. Replacing the silicon dioxide with a low-k dielectric of the same thickness reduces parasitic capacitance, enabling faster switching speeds and lower heat dissipation.

However, significant improvements are needed in the evolution of low-k dielectric processing technology.

SUMMARY

One or more embodiments are directed to methods of patterning low-k dielectric films.

In an embodiment, a method of patterning a low-k dielectric film involves forming and patterning a metal nitride mask layer above a low-k dielectric layer. The low-k dielectric layer is disposed above a substrate. The method also involves passivating the metal nitride mask layer by treating with a plasma based on $O_2/N_2/Si_xF_y$. The method also involves etching a portion of the low-k dielectric layer.

In another embodiment, a method of patterning a low-k dielectric film involves forming and patterning a metal nitride mask layer above a low-k dielectric layer, the low-k dielectric layer disposed above a substrate. Patterning the metal nitride layer involves plasma etching performed at a pressure of approximately 40 mTorr, a source power (Ws) of approximately 200 W, a chemistry based on $CF_4$, $C_4F_8$, $N_2$ and Ar, at a showerhead to wafer gap of approximately 1.6 mm, for a duration of approximately 30 seconds. The method also involves passivating the metal nitride mask layer by treating with a plasma process performed at a pressure of approximately 20 mTorr, a source power (Ws) of approximately 150 W, a chemistry based on $SiF_4$, $N_2$, $O_2$ and Ar, at a showerhead to wafer gap of approximately 1.25 mm, for a duration of approximately 220 seconds. The method also involves etching a portion of the low-k dielectric layer, the etching involving plasma etching performed at a pressure of approximately 40 mTorr, a source power (Ws) of approximately 200 W, a chemistry based on $SiF_4$, $C_4F_8$, $N_2$ and Ar, at a showerhead to wafer gap of approximately 1.6 mm, for a duration of approximately 85 seconds.

In another embodiment, a method of patterning a low-k dielectric film involves forming and patterning a metal nitride mask layer above a low-k dielectric layer, the low-k dielectric layer disposed above a substrate. The method also involves passivating the metal nitride mask layer by treating with a plasma based on $O_2/N_2/Si_xF_y$. The method also involves etching a portion of the low-k dielectric layer. The method also involves repeating the passivating and etching to form trenches having sidewalls in the low-k dielectric layer. The method also involves, subsequent to repeating the passivating and etching to form the trenches, passivating the metal nitride mask layer and the sidewalls of the trenches formed in the low-k dielectric layer by treating with a plasma based on $O_2/N_2/Si_xF_y$, wherein the passivating comprises depositing a protecting material layer on the metal nitride layer and on the sidewalls of the trenches formed in the low-k dielectric layer. The method also involves etching to extend the trenches in the low-k dielectric layer.

DETAILED DESCRIPTION

Figure 1:
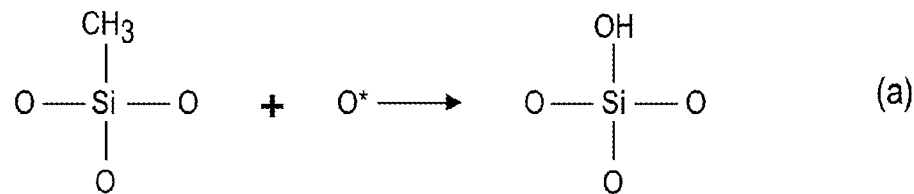
FIG. 1 illustrates mechanisms through which a low-k dielectric layer may be damages or impacted under conventional oxidizing plasma conditions used to remove polymer formed in a conventions fluorocarbon-based etching process.
Figure 1:
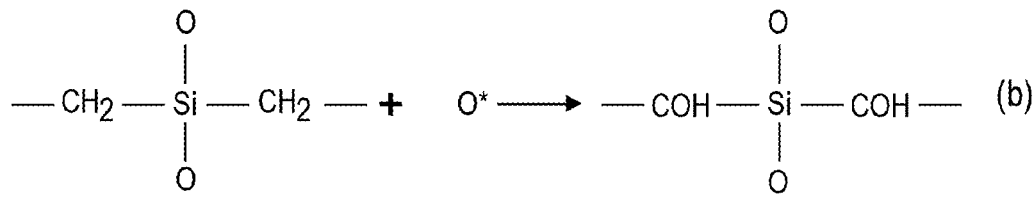
Figure 1:
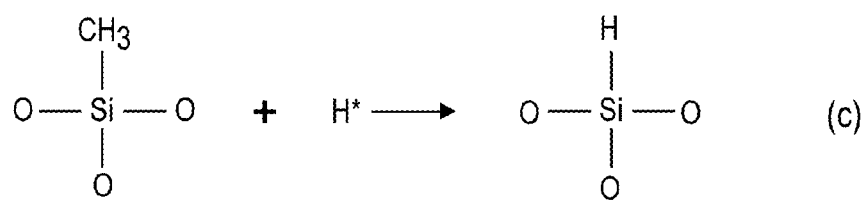

Methods of patterning low-k dielectric films are described. In the following description, numerous specific details are set forth, such as specific plasma treatments and effects for modifying portions of low-k dielectric films, in order to provide a thorough understanding of embodiments of the present invention. It will be apparent to one skilled in the art that embodiments of the present invention may be practiced without these specific details. In other instances, well-known aspects, such as photolithography patterning and development techniques for mask formation, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to dry or plasma etch approaches for patterning porous ultra low-k materials. In an embodiment, the dry or plasma etch is performed in the presence of a metal nitride hardmask, such as a titanium nitride (TiN) hardmask, with little to no erosion of the metal nitride hardmask layer. Embodiments may include one or more of the features: a carbon-free plasma etch, negligible to no low-k damage during etching of a low-k film, and the non-erosion of metal nitride hardmasks during low-k patterning.

To provide context, interconnect processes that employ copper (Cu) metallization and porous low-k dielectric materials are being used to ensure high performance for semiconductor devices of an integrated circuit. One of the main integration issues for Cu/porous carbon doped oxide (SiCOH) low-k interconnects is the plasma-induced modification of ultra-low k (ULK) material as a result of dielectric etching. In the conventional low-k etch process, carbon fluoride process gases (e.g., $CF_4$, $C_xH_yF_z$) are typically employed. An ash step and following wet clean process is usually required to remove carbon-containing sidewall polymer. As a result, plasma ash-induced low-k damage can occur.

By contrast, in order to address the above issues, one or more embodiments described herein involve the use of a non-carbon based approach to selectively remove ULK film with negligible to no k-value shift. Instead of C—F based chemistry, a new approach using one or more silicon fluoride process gases (e.g., $SiF_4$, $Si_xF_y$) in combination with both $O_2$ and $N_2$ is performed as part of a low-k patterning (e.g., etching) process. The use of a plasma formed from $O_2/N_2/Si_xF_y$ can enable formation of $SiOF_x$ polymer(s) to protect exposed sidewalls of ULK films during etching. Etch conditions can be optimized by tuning one or more parameters such as, but not limited to, $SiF_4/O_2$ and $SiF_4/N_2$ ratio, RF bias and source power, argon flow rate, chamber pressure, temperature of electrostatic chuck (ESC), etc. In one such embodiment, the use of relatively small amounts of $O_2$ for plasma formation, as opposed to an $O_2$-free, nitrogen-based plasma processing, enables profile control and passivation control. After dielectric etching, a downstream siconi process can be employed to remove Si-containing sidewall polymer. With a carbon free etch process, processing may be performed with no ash and/or post-etch treatment.

As mentioned above, porous low-k dielectric materials, e.g. porous SiCOH, are typically sensitive to plasma etching. Issues typically arise surrounding damage caused to an Si—$CH_3$ network in an ultra-low-k (ULK) film during an etch process. Such damage may impact the mechanical integrity of a ULK film. Furthermore, there may be an "F memory effect" resulting from polymer formed during a fluorocarbon-based ($C_xF_y$-based) etch process. The sensitivity may also arise from a high porosity which allows etching chemistry to diffuse deep into low-k dielectric film.

Thus, one or more embodiments of the present invention are targeted at the fluorocarbon-free etching of low-k dielectric films, such as ULK films. In an embodiment, one or more methods herein are used to provide a patterning approach with reduced damage or detrimental impact to the low k dielectric film, e.g., in an etch patterning process. In one such embodiment, approaches described herein may be particularly useful for C-doped oxide films. Conventional fluorocarbon chemistry-based ULK etching processes inevitably deposit CF polymer on the ULK surfaces. The polymer is subsequently removed with an oxidizing post etch treatment (PET) plasma. However, the PET plasma may oxidize carbon-containing ULK dielectrics. Oxidized carbon-containing ULK dielectrics may be amenable to undesirable moisture absorption, resulting in the dielectric constant (k value) of the ULK dielectrics to increase. In accordance with an embodiment of the present invention, fluorocarbon-free etching of ultra-low k dielectric is described below.

For comparison purposes, FIG. 1 illustrates mechanisms through which a low-k dielectric layer may be damaged or otherwise impacted under conventional oxidizing plasma conditions used to remove polymer formed in a conventions fluorocarbon-based etching process. Referring to mechanism (a) of FIG. 1, when undergoing an oxidizing ash, an $SiO_3$-methyl fragment, which makes up approximately 40% of a SiCOH low-k film with a dielectric constant of about 2.5, can undesirably lose its methyl group to a hydroxide group. Referring to mechanism (b) of FIG. 1, when undergoing an oxidizing ash, an $SiO_2$—$(CH_2)_2$ fragment, which makes up approximately 10% of a SiCOH low-k film with a dielectric constant of about 2.5, can undesirably be converted to an $SiO_2$—$(COH)_2$ fragment. Referring to mechanism (c) of FIG. 1, when undergoing a reducing ash, an $SiO_3$-methyl fragment, which makes up approximately 40% of a SiCOH low-k film with a dielectric constant of about 2.5, can undesirably lose its methyl group to a hydride ligand (H).

In an embodiment, a fluorocarbon-free etch is used to pattern a low-k dielectric film. Thus, CF polymer does not form, which would otherwise require removal by an ashing process. In one such embodiment, a plasma based on oxygen ($O_2$) in combination with nitrogen ($N_2$) and $Si_xF_y$ (such as $SiF_4$) is used to form an Si—O based deposition on a sidewall formed during a patterning process. The following stage or operation in the etch sequence involves use of a remote plasma or low energy plasma to generate species that can selectively remove such a film from a low k material. One example is the use of $NF_3/NH_3$ based remote plasma to form $NH_4F$ that reacts with the sidewall deposition to form a silicate species. The silicate species sublimes at elevated temperatures. In one such embodiment, the above described process is highly selective to low-k material in that low-k material is not etched in the process. In another embodiment, use of an $O_2/N_2/NF_3$ or $NO/NF_3$ based remote plasma process is employed to etch away Si—N type sidewall deposition. The process is tuned to be highly selective to low-k films. The deposition and removal aspects of the etch process may be repeated multiple times for profile control.

Figure 2:
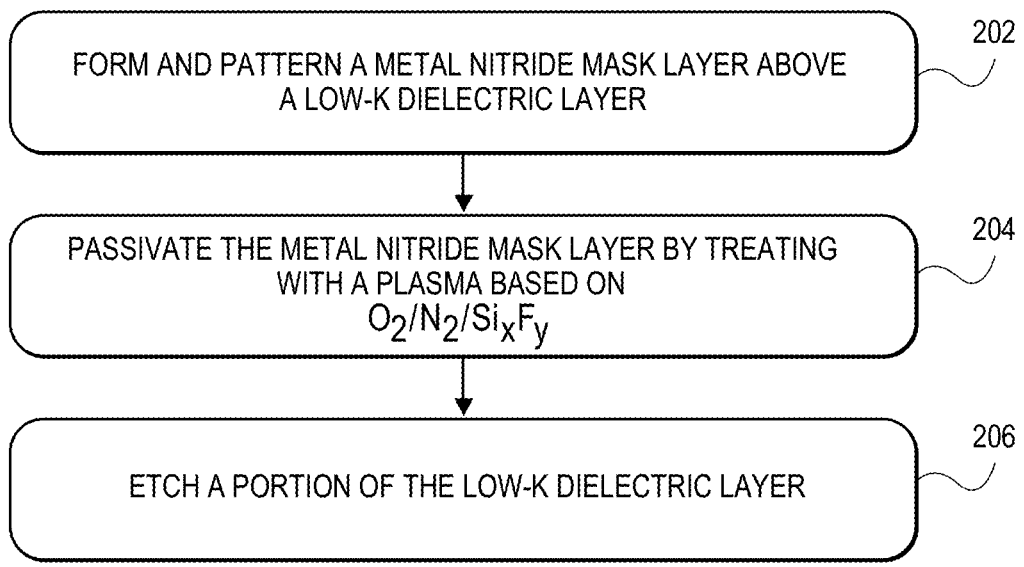
FIG. 2 is a Flowchart representing operations in a method of patterning a low-k dielectric film, in accordance with an embodiment of the present invention.

In an aspect of the present invention, patterning of a low-k dielectric film involves passivating a metal nitride mask layer by treating with a plasma based on $O_2/N_2/Si_xF_y$, and possibly also forming a passivating film on exposed sidewalls of a low-k material during the same treatment. For example, FIG. 2 is a Flowchart 200 representing operations in a method of patterning a low-k dielectric film, in accordance with an embodiment of the present invention. FIGS. 3A-3F illustrate cross-sectional views representing operations in a method of patterning a low-k dielectric film, in accordance with an embodiment of the present invention.

Figure 3A:
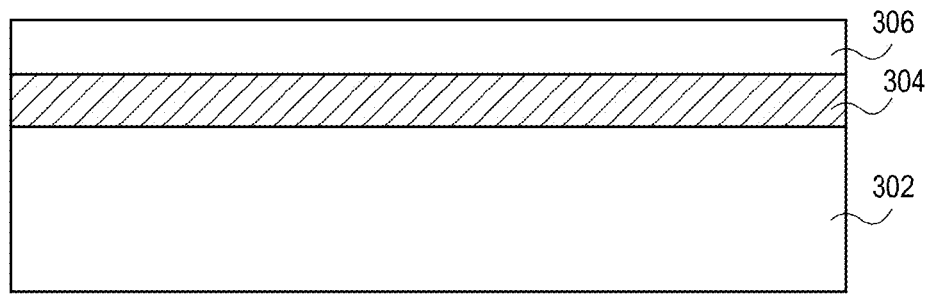
FIGS. 3A-3F illustrate cross-sectional views representing various operations in a method of patterning a low-k dielectric film, corresponding to the Flowchart of FIG. 2, in accordance with an embodiment of the present invention.
Figure 3B:
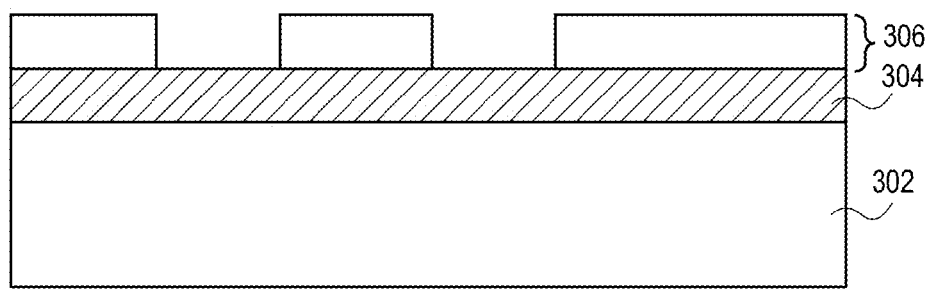

Referring to operation 202 of Flowchart 200 and corresponding FIGS. 3A and 3B, a method of patterning a low-k dielectric film includes forming (FIG. 3A) and patterning (FIG. 3B) a metal nitride mask layer 306 above a low-k dielectric layer 304, the low-k dielectric layer 304 disposed above a substrate 302. In an embodiment, the metal nitride mask layer 306 is formed directly on the low-k dielectric layer 304. In an embodiment, the metal nitride mask layer 306 is a layer of titanium nitride or a layer of tantalum nitride.

In an embodiment, the low-k dielectric layer 304 has a permittivity less than that of silicon dioxide, e.g., less than approximately 3.9. In one embodiment, the low-k dielectric layer 304 is a material such as, but not limited to, a fluorine-doped silicon dioxide, a carbon-doped silicon dioxide, a porous silicon dioxide, a porous carbon-doped silicon dioxide, a porous SiLK, a spin-on silicone based polymeric dielectric, or a spin-on organic polymeric dielectric. In accordance with an embodiment of the present invention, the low-k dielectric layer 304 is a porous SiCOH layer having a dielectric constant of less than 2.7.

Substrate 302 may be composed of a material suitable to withstand a fabrication process and upon which semiconductor processing layers may suitably reside. In accordance with an embodiment of the present invention, substrate 302 is composed of a group IV-based material such as, but not limited to, crystalline silicon, germanium or silicon/germanium. In a specific embodiment, providing substrate 302 includes providing a monocrystalline silicon substrate. In a particular embodiment, the monocrystalline silicon substrate is doped with impurity atoms. In another embodiment, substrate 302 is composed of a III-V material. In an embodiment, a plurality of semiconductor devices resides on substrate 302, below low-k dielectric layer 304.

Figure 3C:
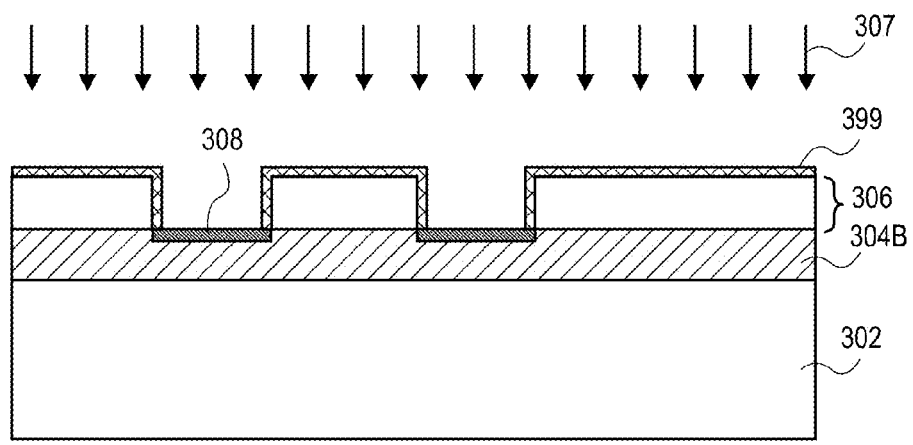

Referring to operation 204 of Flowchart 200 and corresponding FIG. 3C, patterning the low-k dielectric film also includes passivating the metal nitride mask layer 306 by treating with a plasma 307 based on $O_2/N_2/Si_xF_y$, e.g., where $Si_xF_y$ is $SiF_4$. For example, in an embodiment, a protecting layer 399 is formed. The protecting layer 399 may be a deposited material, may be formed by modifying a surface of the metal nitride mask 306, or a combination of both. In a specific embodiment, metal nitride mask 306 is a titanium nitride mask, and protecting layer 399 is composed at least somewhat from titanium oxide formed by oxidation from the $O_2$ included in the plasma 307. In an embodiment, treating with the plasma based on $O_2/N_2/Si_xF_y$ further involves forming a protecting layer on a portion of the low-k dielectric layer 304 that is to be protected from etching, as discussed in greater detail below.

Referring again to FIG. 3C, in an embodiment, either plasma 307, or a second plasma treatment is used to modify exposed portions of the low-k dielectric layer 304. The exposed portions of the low-k dielectric layer 304 are those portions exposed by the patterned mask 306. The plasma is used to modify the exposed portions to provide modified portions 308 and unmodified portion 304B of the low-k dielectric layer 304. Thus, in an embodiment, deposition of a protective layer and modification of a low-k film are performed in a same or sequential process.

In an embodiment, the passivating plasma process involves an $SiF_4/N_2/O_2/Ar$-based plasma. In one such embodiment, the low-k sidewall is protected with an SiON or SiONH layer. In a specific embodiment, the Ar from the plasma is used to bombard only the bottom portion of the trench, selectively and anisotropically modifying the low-k material. In an embodiment, in place of or in addition to $SiF_4$, species such as $Si_2F_6$ may be used.

As mentioned briefly above, in another embodiment, plasma process 307, or first stage process, is performed as a two-operation process. In the single operation approach, protection layer deposition and low-k film treatment are performed at the same time (as depicted in FIG. 3C), while in a two-operation approach, protection layer deposition and low-k film treatment are performed in two different operations, as described below in association with FIGS. 4A and 4B.

Figure 4A:
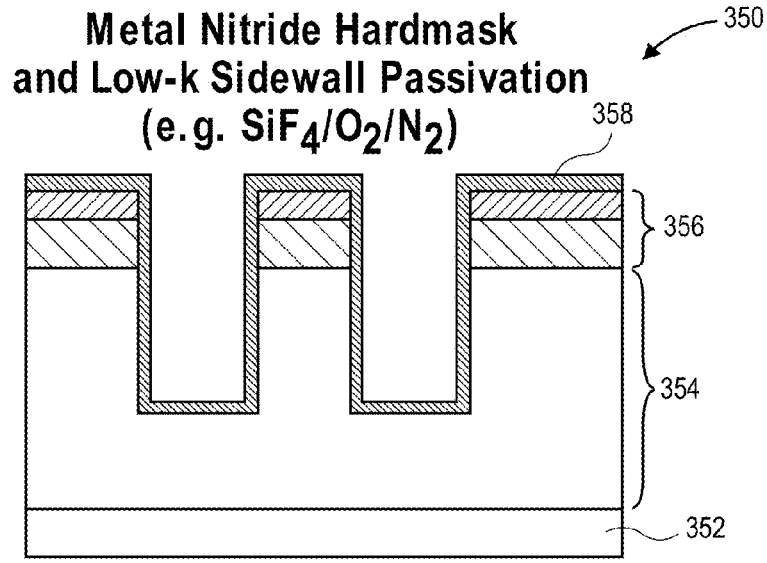
FIGS. 4A and 4B illustrate cross-sectional views representing a low-k modification as preformed in two operations, in accordance with an embodiment of the present invention.
Figure 4B:
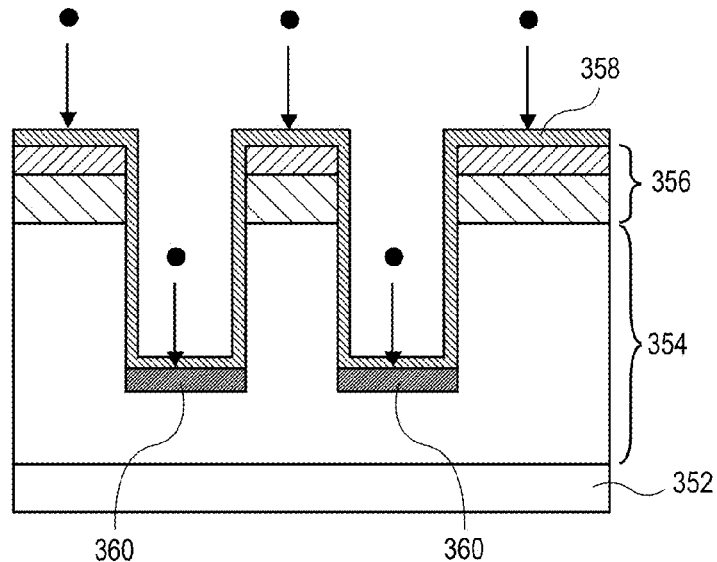

FIGS. 4A and 4B illustrate cross-sectional views representing a low-k modification as preformed in two operations, such as the two-operation first stage plasma embodiments described immediately above, in accordance with an embodiment of the present invention. Referring to FIG. 4A, a material stack 350 including a substrate 352, low-k material 354 and mask stack 356 (including a metal nitride layer) has a liner layer 358 deposited thereon, e.g., by $SiF_4/O_2/N_2$ deposition. Referring then to FIG. 4B, ultra-low-k treatment, e.g., using He, $N_2$, or Ar ions, is used to modify (forming regions 360), through the liner 358 portions of the low-k material 354.

Figure 3D:
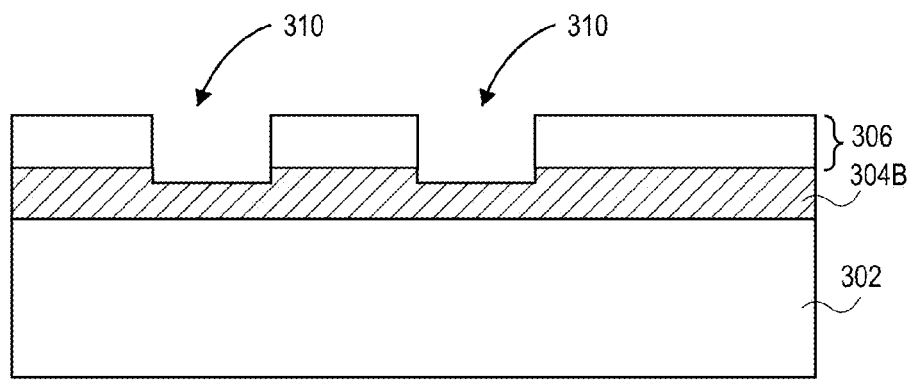

Referring to operation 206 of Flowchart 200 and now to corresponding FIG. 3D, patterning the low-k dielectric film also includes etching the low-k material, e.g., by removing the modified portions 308 of the low-k dielectric layer 304B. In an embodiment, the removal is selective to the metal nitride mask layer 306 and to the unmodified portions 304B of the low-k dielectric layer 304.

Thus, in accordance with an embodiment of the present invention, etching of a low-k dielectric film is achieved by partial film conversion of the low-k dielectric layer. In one embodiment, the etching may be referred to as atomic layer etching or molecular level etching (MLE) since only one or a few layers of exposed portions of the low-k dielectric film are converted and subsequently removed per process cycle. As exemplified above, in one embodiment, the etching process includes first selectively modifying the composition of a horizontal ULK surface with a first plasma and then removing the modified portions with a second, remote, plasma. In one embodiment, approaches described herein represent true film conversion by methyl knock-off from a low-k dielectric film.

By contrast, conventional chemical etching typically involves deposition of polymer on ULK surfaces, which are removed with an oxidizing PET operation. An aqueous-based clean is used to remove damaged ULK, which may result in line bending and moisture absorption into the ULK. Instead, in an embodiment herein, essentially damage free etching of a ULK material is achieved by completely avoiding CF etching chemistry. An inert plasma is used to remove carbon from a ULK surface. A downstream plasma is then used to remove modified portions of the ULK. The downstream plasma etching may be extremely selective to the ULK due to its nature of pure chemical etching.

The above method described in association with operations 204 and 206 of Flowchart 200 may be repeated as required to achieve a suitable extent of patterning of the low-k dielectric layer 304. For example, referring again to FIG. 3D, trenches 310 are formed in the low-k dielectric layer 304, leaving partially patterned, and unmodified, low-k dielectric layer 304B. The depth of trenches 310 may not be deep enough for suitable patterning of the low-k dielectric layer 304, especially since the modification and removal process described above may only remove one or several molecular layers at a time.

Accordingly, in an embodiment, the low-k dielectric layer 304 is subjected to multiple modification and removal processes of exposed portions thereof until a depth of trenches 310 suitable for subsequent processing requirements is achieved. In one such embodiment, the modifications and removal is repeated until partial trenches are formed in, but not entirely through, the low-k dielectric layer 304. In another such embodiment, the modifications and removal is repeated until complete trenches are formed entirely through the low-k dielectric layer 304.

Figure 3E:
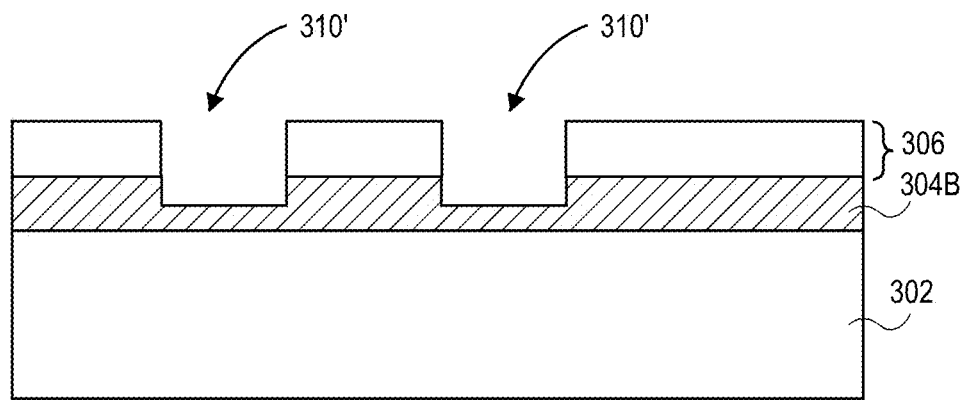
Figure 3F:
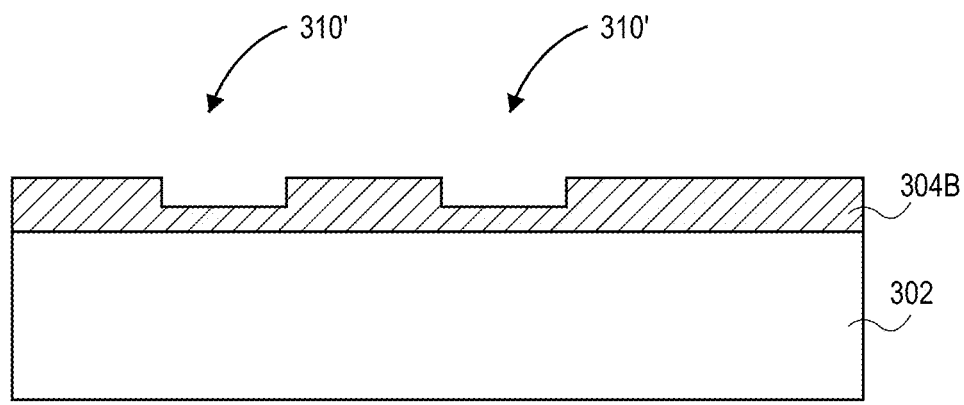

As an example of a cyclic process, FIGS. 3E and 3F illustrate an embodiment in which, in conjunction with FIGS. 3A-3D, a total of two cycles are performed to pattern a low-k dielectric layer. It is to be understood that many more than two modification and removal cycles may need to be performed to suitably pattern a low-k dielectric film.

Referring to FIG. 3E, exposed portions of the low-k dielectric layer 304B, e.g., exposed surfaces of trenches 310, are modified and etched with a second modification plasma process involving first and second remote plasma processes in a same operation. The exposed portions of the low-k dielectric layer 304B are those portions exposed by the patterned mask 306 as well as exposed sidewalls of the low-k dielectric layer 304B. The second iteration of the modification and etch cycle of FIG. 3E formed deeper trenches 310' and hence a patterned low-k film 304C.

Referring to FIG. 3F, once a desired depth for trenches 310' is achieved, which may involve numerous cycles of the above described modification and removal process, the metal nitride mask 306 may be removed. However, in an embodiment, care must be taken upon removal of metal nitride mask 306 such that the removal is selective against the patterned low-k dielectric layer 304C and does not detrimentally impact (e.g., by raising the dielectric constant) the patterned low-k dielectric layer 304C.

Overall, in an embodiment, a non-carbon based approach is used to selectively remove portions of a low-k film with no k-value shift. In one embodiment, a sequential process is used where, first, an $O_2/N_2/Si_xF_y$-based plasma is used for etching with sidewall protection and, second, a highly selective radical based removal is employed. Advantages may include, but are not limited to, use of a carbon-free process (no ash or post-etch treatment necessarily needed), potentially no wet clean needed, low ion energies used leading to minimal metal hardmask erosion, and self limiting treatment and removal operation leading to good depth and uniformity control.

In an embodiment, one or more of the above (or below) described processes is performed in a plasma etch chamber. For example, in one embodiment, one or more of the above processes is performed in an Applied Centura® Enabler dielectric etch system, available from Applied Materials of Sunnyvale, Calif., USA. In another embodiment, one or more of the above processes is performed in an Applied Materials™ AdvantEdge G3 etcher, also available from Applied Materials of Sunnyvale, Calif., USA.

Figure 5:
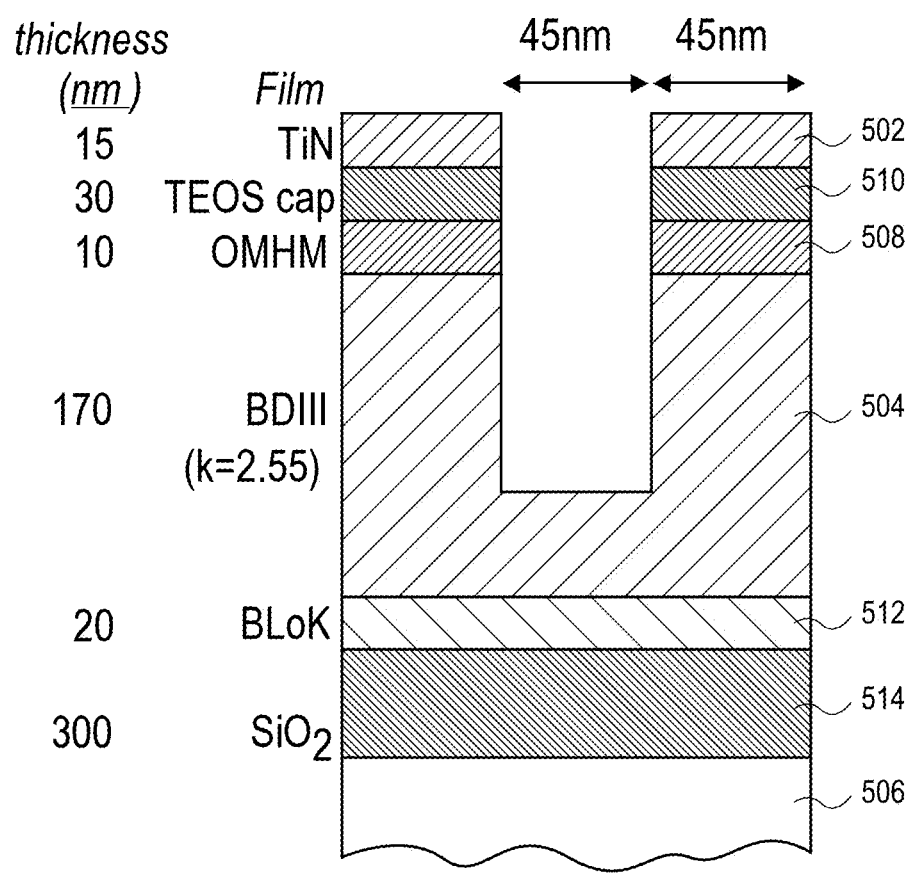
FIG. 5 illustrates a cross-sectional view of an exemplary material stack including low-k dielectric layer and a metal nitride hardmask layer, in accordance with an embodiment of the present invention.

FIG. 5 illustrates a cross-sectional view of an exemplary material stack including low-k dielectric layer and a metal nitride hardmask layer, in accordance with an embodiment of the present invention. Referring to FIG. 5, the material stack includes an approximately 15 nanometer titanium nitride (TiN) hardmask 502 and an approximately 170 nanometer ultra-low k material layer (e.g., Black Diamond (BD) III: k=2.55) 504, which may be disposed above a silicon wafer 506. Other layers include intervening layers such as a hard mask layer, e.g., a carbon-doped oxide hardmask layer (OMHM) layer (e.g., approximately 10 nanometers) 508. Furthermore, an intervening oxide layer (e.g., TEOS cap of approximately 30 nanometers) 510 can be included between the titanium nitride (TiN) hardmask 502 and the ultra-low k material layer 504, while an etch stop layer (BLoK) 512 can be included below the ultra-low k material layer 504, as is also depicted in FIG. 5. It is to be understood that the specific film stack shown is one of many suitable arrangements for low k etch processing described herein, and is provided for illustration purposes. It is also to be understood that a complete film stack could also include underlying front of line (FEOL) device layers, such as transistor layers, as well as underlying BEOL metal layers. Furthermore, in the case that a sample is merely a test vehicle for etch process development, basic intervening layers such as a silica glass ($SiO_2$, e.g., 300 nanometers) layer 514 can be included for simplicity of process design and test.

Although a host of material layers is mentioned above and shown in FIG. 5, some key layers that will typically be involved in a process involving a low k trench etch process flow can include a metal hard mask layer and a low-k dielectric layer. In one such embodiment, the metal hard mask layer is a metal-containing layer such as, but not limited to, a layer of titanium nitride or a layer of tantalum nitride.

Patterning of a low-k dielectric layer may be conducted in processing equipment suitable to provide an etch plasma in proximity to a sample for etching. For example, FIG. 6A illustrates a system in which a method of low-k dielectric film patterning is performed, in accordance with an embodiment of the present invention.

Figure 6A:
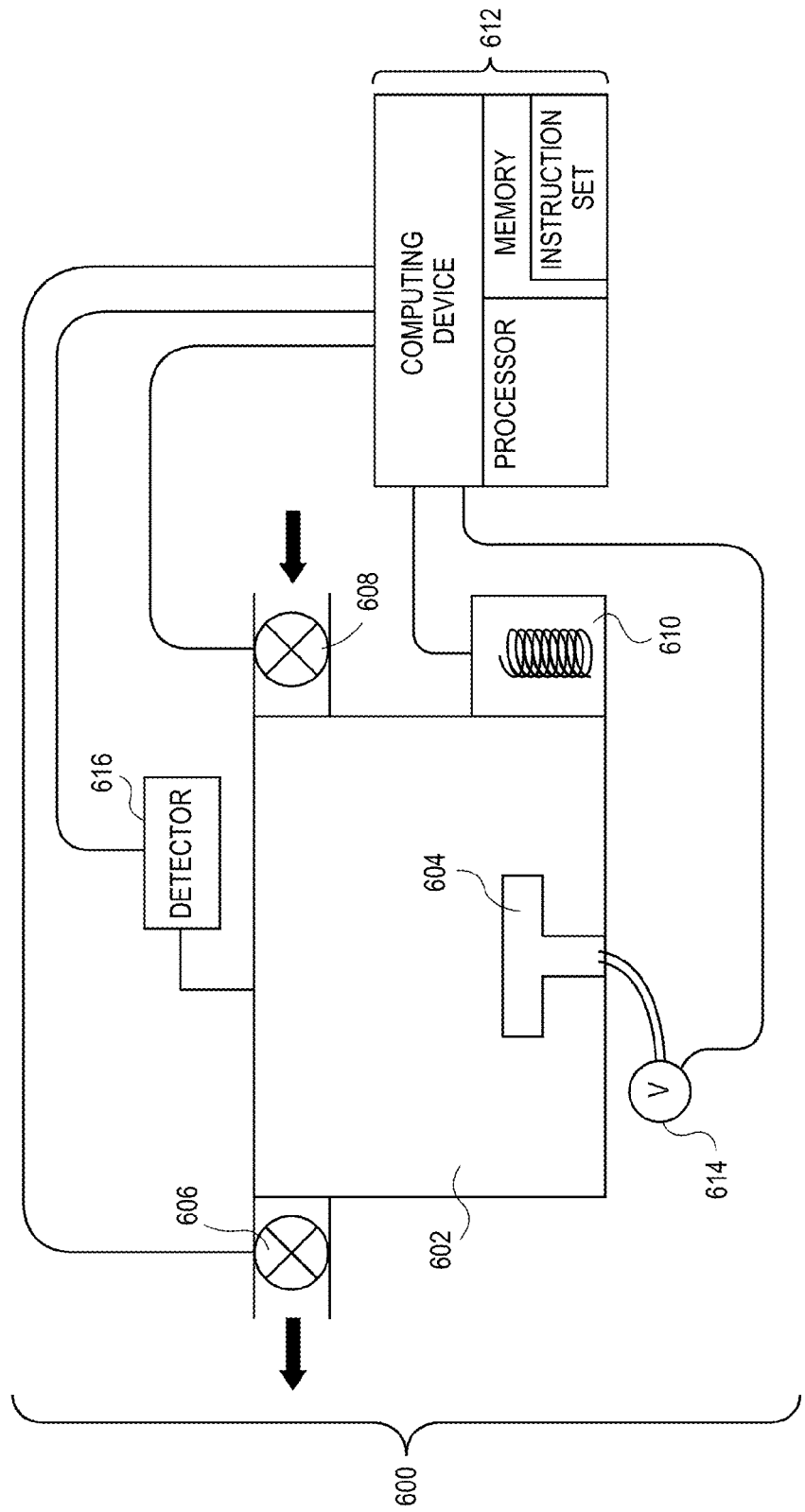
FIG. 6A illustrates a system in which a method of low-k dielectric film patterning is performed, in accordance with an embodiment of the present invention.

Referring to FIG. 6A, a system 600 for conducting a plasma etch process includes a chamber 602 equipped with a sample holder 604. An evacuation device 606, a gas inlet device 608 and a plasma ignition device 610 are coupled with chamber 602. A computing device 612 is coupled with plasma ignition device 610. System 600 may additionally include a voltage source 614 coupled with sample holder 604 and a detector 616 coupled with chamber 602. Computing device 612 may also be coupled with evacuation device 606, gas inlet device 608, voltage source 614 and detector 616, as depicted in FIG. 6A.

Chamber 602 and sample holder 604 may include a reaction chamber and sample positioning device suitable to contain an ionized gas, i.e. a plasma, and bring a sample in proximity to the ionized gas or charged species ejected there from. Evacuation device 606 may be a device suitable to evacuate and de-pressurize chamber 602. Gas inlet device 608 may be a device suitable to inject a reaction gas into chamber 602. Plasma ignition device 610 may be a device suitable for igniting a plasma derived from the reaction gas injected into chamber 602 by gas inlet device 608. Detection device 616 may be a device suitable to detect an end-point of a processing operation. In one embodiment, system 600 includes a chamber 602, a sample holder 604, an evacuation device 606, a gas inlet device 608, a plasma ignition device 610 and a detector 616 similar to, or the same as, those included in an Applied Centura® Enabler dielectric etch system or an Applied Materials™ AdvantEdge G3 system.

Figure 6B:
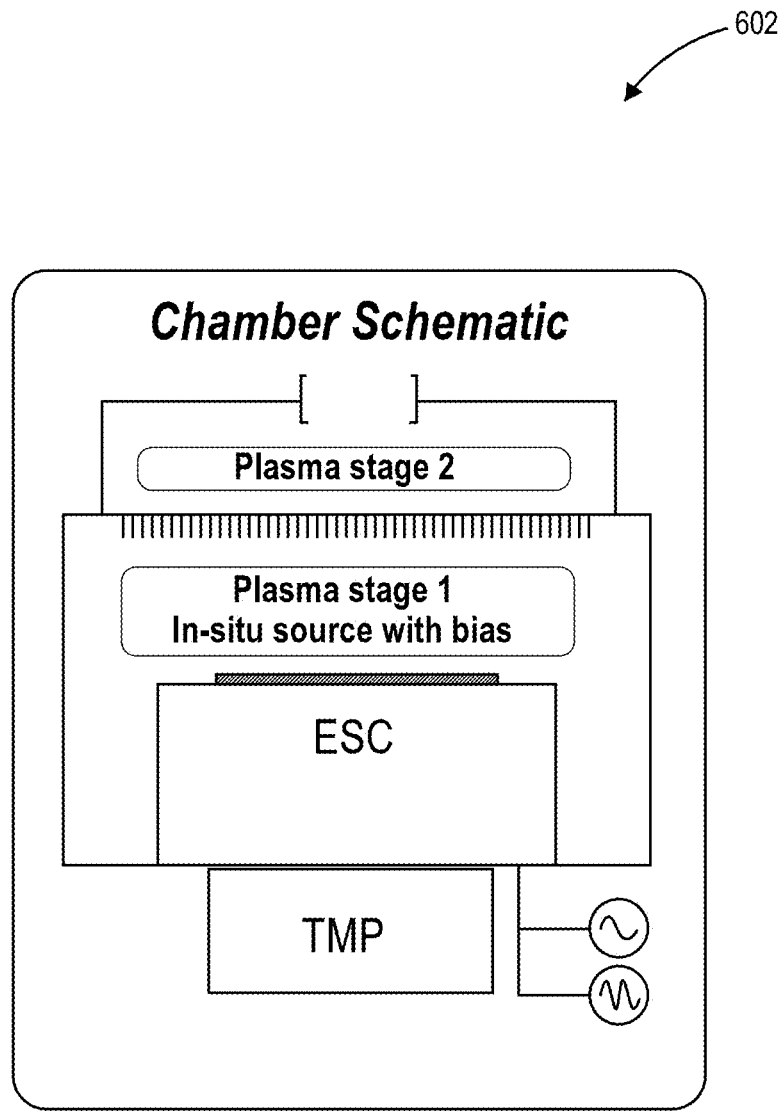
FIG. 6B illustrates a schematic of a possible configuration for the chamber of FIG. 6A, in accordance with an embodiment of the present invention.

FIG. 6B illustrates a schematic of a possible configuration for chamber 602 of FIG. 6A, in accordance with an embodiment of the present invention. Referring to FIG. 6B, and in association with the description of FIGS. 3C and 3D, a chamber 602 has a first stage (plasma stage 1, which may include an in-situ source with bias) for performing a first, non-remote, plasma process. For example, a plasma process involving formation of a protective or passivation layer along with modification of a low-k film may be performed at stage 1. The chamber 602 also has a second stage (plasma stage 2) for performing a remote plasma process. For example, a plasma process involving cleaning of a deposited protection layer along with modified low-k material may be performed at stage 2. Such a configuration for chamber 602 may enable fine tuning radicals/ion ratio. Benefits of such a tunable source may include control of etch anisotropy polymer-free treatments. Layer-by-layer removal defined by depth of modified layer may also be performed.

In an embodiment, low-k patterning process using a metal nitride hardmask is performed in chamber such as chamber 600. The recipe can involve one or more, or all, of the following operations 1-4. In one such embodiment, all operations 1-4 are performed in the sequence provided below and in a single pass in chamber.

Operation 1 is a cap etch portion performed at a pressure of approximately 40 mTorr, a bottom bias (Wb) of approximately 300 W, a source power (Ws) of approximately 200 W, and a chemistry based on $CF_4$ (approximately 11 sccm), $C_4F_8$ (approximately 56 sccm), $N_2$ (approximately 15 sccm) and Ar (approximately 500 sccm), a showerhead to wafer gap of approximately 1.6 mm, an ESC temperature of approximately 65 C, for approximately 30 seconds. Such an operation may be used to etch, e.g., mask layer 306 of FIG. 3B or the cap layers (such as TEOS cap) of FIG. 5.

Operation 2 is a low k etch deposition portion performed at a pressure of approximately 20 mTorr, a bottom bias (Wb) of approximately 150 W, a source power (Ws) of approximately 150 W, a chemistry based on $SiF_4$ (approximately 200 sccm), $N_2$ (approximately 45 sccm), $O_2$ (approximately 1.5 sccm) and Ar (approximately 600 sccm), a showerhead to wafer gap of approximately 1.25 mm, an ESC temperature of approximately 65 C, for approximately 220 seconds. Such an operation may be used to passivate a metal nitride hardmask and, additionally, exposed sidewalls of a low-k dielectric material.

Operation 3 is a low k main etch portion performed at a pressure of approximately 40 mTorr, a bottom bias (Wb) of approximately 300 W, a source power (Ws) of approximately 200 W, and a chemistry based on $SiF_4$ (approximately 45 sccm), $C_4F_8$ (approximately 22 sccm), $N_2$ (approximately 15 sccm) and Ar (approximately 500 sccm), a showerhead to wafer gap of approximately 1.6 mm, an ESC temperature of approximately 65 C/71 C, for approximately 85 seconds.

Operation 4 is a post etch treatment performed at a pressure of approximately 15 mTorr, a bottom bias (Wb) of approximately 200 W, a chemistry based on $N_2$ (approximately 200 sccm) and $O_2$ (approximately 2.5 sccm), a showerhead to wafer gap of approximately 3.5 mm, an ESC temperature of approximately 65 C/71 C, for approximately 15 seconds.

Figure 7:
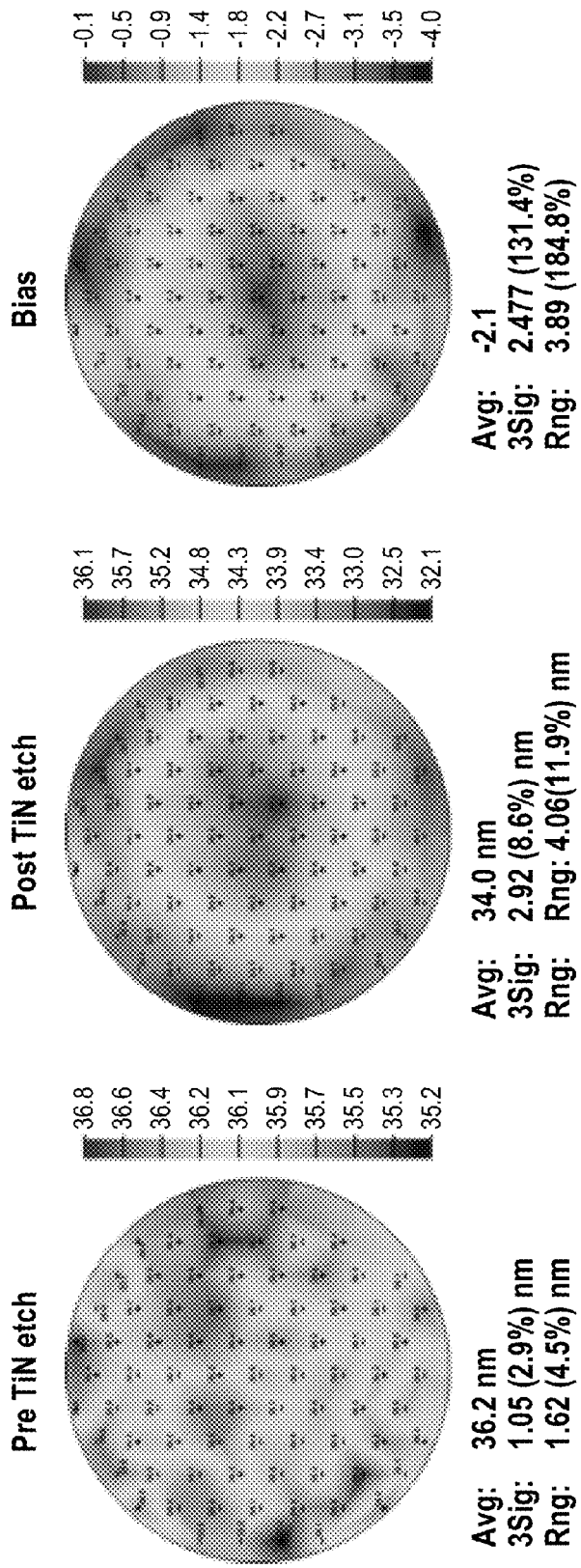
FIG. 7 illustrates is a series of thickness maps for etch profiles pre titanium nitride (TiN) etch, post TiN etch, and the resulting bias, in accordance with an embodiment of the present invention.

FIG. 7 illustrates is a series of thickness maps for etch profiles pre titanium nitride (TiN) etch, post TiN etch, and the resulting bias, in accordance with an embodiment of the present invention. Referring to FIG. 7, use of an etch process that is passivating for a metal nitride hardmask shows significant improvement for erosion and profile, in that there is little erosion. Furthermore, the demonstrated etch process shows good selectivity to the passivated or protected TiN hardmask layer.

Embodiments of the present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
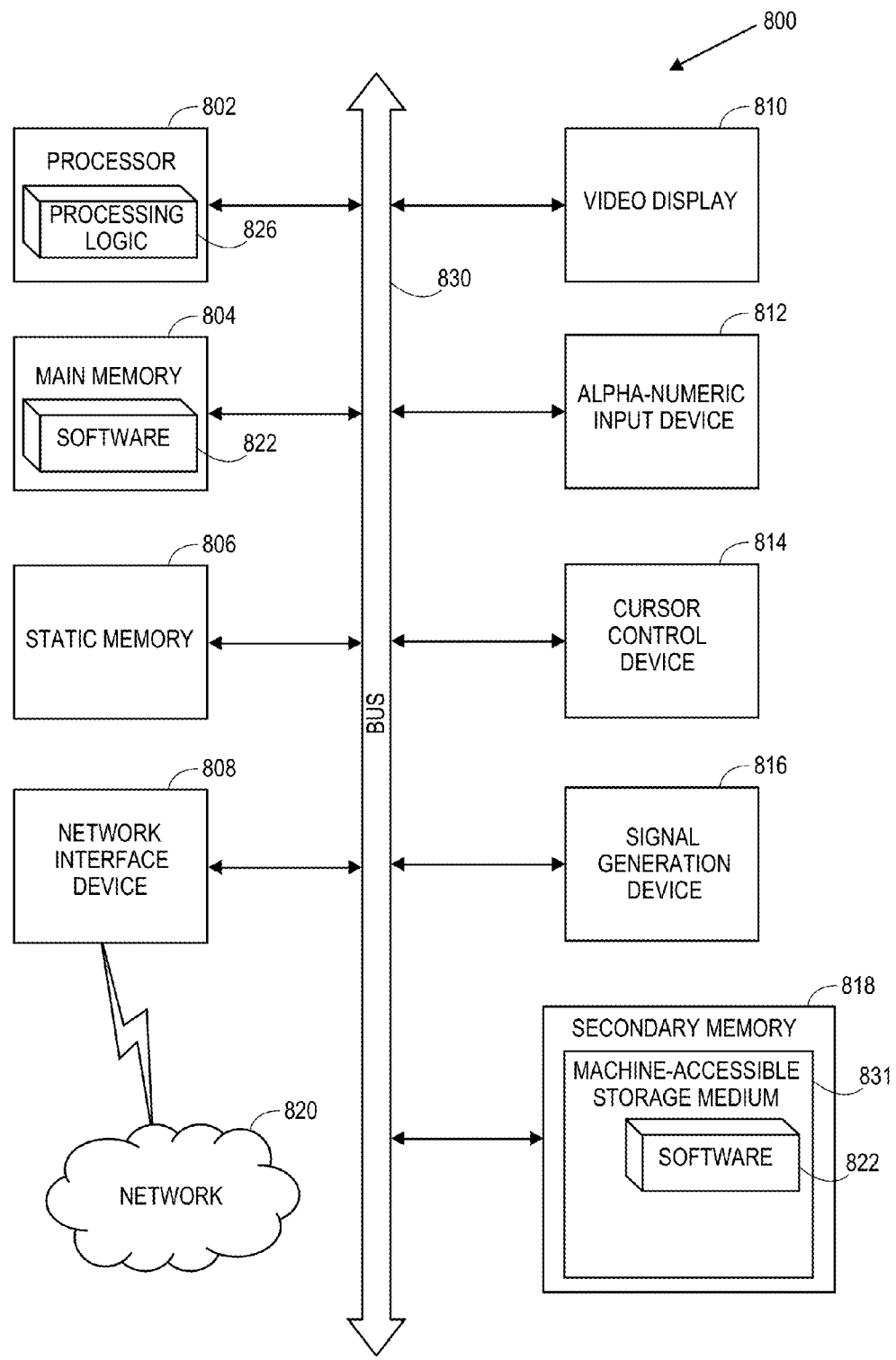
FIG. 8 illustrates a block diagram of an exemplary computer system, in accordance with an embodiment of the present invention.

FIG. 8 illustrates a diagrammatic representation of a machine in the exemplary form of a computer system 800 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In one embodiment, computer system 800 is suitable for use as computing device 612 described in association with FIG. 6A.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations discussed herein.

The computer system 800 may further include a network interface device 808. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 831 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 831 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of patterning a low-k dielectric layer. The method includes forming and patterning a metal nitride mask layer above a low-k dielectric layer, the low-k dielectric layer disposed above a substrate. The metal nitride mask layer is passivated by treating with a plasma based on $O_2/N_2/Si_xF_y$. A portion of the low-k dielectric layer is etched. In one embodiment, treating with the plasma based on $O_2/N_2/Si_xF_y$ further involves forming a protecting layer on a second portion of the low-k dielectric layer. The second portion is not etched during the etching of the portion of the low-k dielectric layer.

Thus, methods of patterning low-k dielectric films have been disclosed.

What is claimed is:

1. A method of patterning a low-k dielectric film, the method comprising:
   forming and patterning a metal nitride mask layer above a low-k dielectric layer, the low-k dielectric layer disposed above a substrate;
   passivating the metal nitride mask layer by treating with a plasma based on $O_2/N_2/Si_xF_y$; and
   etching a portion of the low-k dielectric layer.

2. The method of claim 1, wherein passivating the metal nitride mask layer comprises depositing a protecting material layer on the metal nitride layer.

3. The method of claim 2, further comprising:
   subsequent to etching the portion of the low-k dielectric layer, removing the protecting material layer.

4. The method of claim 1, wherein passivating the metal nitride mask layer comprises modifying a surface of the metal nitride layer.

5. The method of claim 1, wherein treating with the plasma based on $O_2/N_2/Si_xF_y$ further comprises forming a protecting layer on a second portion of the low-k dielectric layer, wherein the second portion is not etched during the etching of the portion of the low-k dielectric layer.

6. The method of claim 1, wherein $Si_xF_y$ is $SiF_4$.

7. The method of claim 1, wherein the passivating the metal nitride mask layer by treating with the plasma based on $O_2/N_2/Si_xF_y$ is a carbon-free process.

8. The method of claim 1, wherein forming and patterning the metal nitride mask layer above the low-k dielectric layer comprises forming a layer of titanium nitride or a layer of tantalum nitride above a porous carbon-doped oxide (Si-COH) layer having a dielectric constant of less than 2.7.

9. A method of patterning a low-k dielectric film, the method comprising:
   forming and patterning a metal nitride mask layer above a low-k dielectric layer, the low-k dielectric layer disposed above a substrate, wherein patterning the metal nitride layer comprises plasma etching performed at a pressure of approximately 40 mTorr, a source power (Ws) of approximately 200 W, a chemistry based on $CF_4$, $C_4F_8$, $N_2$ and Ar, at a showerhead to wafer gap of approximately 1.6 mm, for a duration of approximately 30 seconds;
   passivating the metal nitride mask layer by treating with a plasma process performed at a pressure of approximately 20 mTorr, a source power (Ws) of approximately 150 W, a chemistry based on $SiF_4$, $N_2$, $O_2$ and Ar, at a showerhead to wafer gap of approximately 1.25 mm, for a duration of approximately 220 seconds; and
   etching a portion of the low-k dielectric layer, wherein the etching comprises plasma etching performed at a pressure of approximately 40 mTorr, a source power (Ws) of approximately 200 W, a chemistry based on $SiF_4$, $C_4F_8$, $N_2$ and Ar, at a showerhead to wafer gap of approximately 1.6 mm, for a duration of approximately 85 seconds.

10. The method of claim 9, wherein passivating the metal nitride mask layer by treating with the plasma process further comprises forming a protecting layer on a second portion of the low-k dielectric layer, wherein the second portion is not etched during the etching of the portion of the low-k dielectric layer.

11. The method of claim 9, wherein passivating the metal nitride mask layer comprises depositing a protecting material layer on the metal nitride layer.

12. The method of claim 11, further comprising:
   subsequent to etching the portion of the low-k dielectric layer, removing the protecting material layer with a plasma process performed at a pressure of approximately 15 mTorr, a chemistry based on $N_2$ and $O_2$, at a showerhead to wafer gap of approximately 3.5 mm, for a duration of approximately 15 seconds.

13. The method of claim 9, wherein passivating the metal nitride mask layer comprises modifying a surface of the metal nitride layer.

14. The method of claim 9, wherein the passivating the metal nitride mask layer by treating with the plasma process is a carbon-free process.

15. The method of claim 9, wherein forming and patterning the metal nitride mask layer above the low-k dielectric layer comprises forming a layer of titanium nitride or a layer of tantalum nitride above a porous carbon-doped oxide (Si-COH) layer having a dielectric constant of less than 2.7.

16. A method of patterning a low-k dielectric film, the method comprising:
   forming and patterning a metal nitride mask layer above a low-k dielectric layer, the low-k dielectric layer disposed above a substrate;
   passivating the metal nitride mask layer by treating with a plasma based on $O_2/N_2/Si_xF_y$;
   etching a portion of the low-k dielectric layer;
   repeating the passivating and etching to form trenches having sidewalls in the low-k dielectric layer; and
   subsequent to repeating the passivating and etching to form the trenches, passivating the metal nitride mask layer and the sidewalls of the trenches formed in the low-k dielectric layer by treating with a plasma based on $O_2/N_2/Si_xF_y$, wherein the passivating comprises depositing a protecting material layer on the metal nitride layer and on the sidewalls of the trenches formed in the low-k dielectric layer; and
   etching to extend the trenches in the low-k dielectric layer.

17. The method of claim 16, further comprising:
   subsequent to etching to extend the trenches in the low-k dielectric layer, removing the protecting material layer.

18. The method of claim 16, wherein $Si_xF_y$ is $SiF_4$.

19. The method of claim 16, wherein the passivating the metal nitride mask layer by treating with the plasma based on $O_2/N_2/Si_xF_y$ is a carbon-free process.

20. The method of claim 16, wherein forming and patterning the metal nitride mask layer above the low-k dielectric layer comprises forming a layer of titanium nitride or a layer of tantalum nitride above a porous carbon-doped oxide (Si-COH) layer having a dielectric constant of less than 2.7.

* * * * *